United States Patent
Kohnen et al.

[19]

[11] Patent Number: 6,014,447

[45] Date of Patent: Jan. 11, 2000

[54] PASSIVE VEHICLE CLASSIFICATION USING LOW FREQUENCY ELECTROMAGNETIC EMANATIONS

[75] Inventors: Kirk Kohnen, Fullerton; Wilbur W. Eaton, Placentia, both of Calif.

[73] Assignee: Raytheon Company, Lexington, Mass.

[21] Appl. No.: 08/821,749

[22] Filed: Mar. 20, 1997

[51] Int. Cl.[7] .................................................. H04B 1/00
[52] U.S. Cl. ............................ 381/86; 381/56; 381/71.1; 340/933; 340/941; 701/32
[58] Field of Search .................. 381/71.1, 71.2, 381/71.4, 71.14, 86, 94.2, 94.3, FOR 123, FOR 124, 56; 340/825.71, 825.75, 933, 941, 825.31, 825.34; 701/29, 32

[56] References Cited

U.S. PATENT DOCUMENTS

| | | | |
|---|---|---|---|
| 3,727,488 | 4/1973 | Wakamatsu et al. | 477/131 |
| 3,889,181 | 6/1975 | Greer | 340/943 |
| 4,829,434 | 5/1989 | Karmel et al. | 701/59 |
| 4,876,721 | 10/1989 | Kerr et al. | 381/56 |
| 5,396,233 | 3/1995 | Hofmann | 340/933 |
| 5,426,363 | 6/1995 | Akagi et al. | 340/941 |
| 5,455,868 | 10/1995 | Sergent et al. | 381/56 |
| 5,473,315 | 12/1995 | Holroyd | 381/56 |
| 5,493,291 | 2/1996 | Bruggemann | 340/941 |
| 5,528,234 | 6/1996 | Mani et al. | 340/933 |
| 5,557,268 | 9/1996 | Hughes et al. | 701/29 |
| 5,559,835 | 9/1996 | Betts | 375/265 |
| 5,600,558 | 2/1997 | Mearek et al. | 701/29 |
| 5,614,894 | 3/1997 | Stanczyk | 340/933 |
| 5,635,903 | 6/1997 | Koike et al. | 381/86 |
| 5,661,473 | 8/1997 | Paschal | 340/933 |
| 5,677,960 | 10/1997 | Unno et al. | 381/86 |
| 5,761,626 | 6/1998 | Tascillo et al. | 701/29 |
| 5,764,139 | 6/1998 | Nojima et al. | 701/29 |
| 5,808,907 | 9/1998 | Shetty et al. | 701/29 |
| 5,809,437 | 9/1998 | Breed | 701/29 |
| 5,828,334 | 10/1998 | Deegan | 342/90 |

FOREIGN PATENT DOCUMENTS

| | | | |
|---|---|---|---|
| 4-100200 | 4/1992 | Japan | 340/941 |
| 2140602 | 11/1984 | United Kingdom | 340/941 |
| 2228606 | 8/1990 | United Kingdom | 340/941 |

OTHER PUBLICATIONS

Palatnick et al., "Automatic Vehicle ID Systems—Method of Approach", IEEE Transactions on Vehicular Technology, vol. VT–19, No. 1, pp. 128–136, Feb. 1990.

*Primary Examiner*—Forester W. Isen
*Assistant Examiner*—Xu Mei
*Attorney, Agent, or Firm*—Colin M. Raufer; Leonard A. Alkov; Glenn H. Lenzen, Jr.

[57] ABSTRACT

A system for passively sensing low frequency (5 Hz to 50 kHz) EM emanations from vehicles and classifying them on that basis. A temporal frequency response is computed for the sensed EM emanations. Harmonic, non-harmonic and temporal features are extracted from the response and used to classify the vehicle. In the preferred embodiment, the temporal frequency response is displayed as a time, frequency and intensity plot, from which a technician visually extracts these features. The features can then be used either to determine a "signature" for classifying the vehicle or to determine specific characteristics which, in turn, can be used to classify the vehicle. Alternately, the feature extraction and classification can be performed by an automated classifier.

24 Claims, 4 Drawing Sheets

PASSIVE VEHICLE CLASSIFICATION USING LOW FREQUENCY ELECTRO-MAGNETIC EMANATIONS

This invention was made with Government support under Contract No. N66001-94-C-6029 awarded by the Department of the Navy. The Government has certain rights in this invention.

BACKGROUND OF THE INVENTION

1. Field of the Invention

This invention relates to passive vehicle classification and more specifically to a system and method for passively sensing a vehicle's low frequency electro-magnetic (EM) emanations and identifying harmonic interrelationships, strong non-harmonic signals, and temporal properties to classify the vehicle.

2. Description of the Related Art

Passive vehicle detection and classification systems rely on passively sensed visual, thermal, seismic and acoustical data to first detect and then classify vehicles. Technicians are trained to recognize patterns in the sensed data as particular vehicle characteristics and then use them to classify the vehicle. Depending upon the application, the type of vehicles involved, and the environment in which the detection takes place, it might not be practical to gather certain types of data. This reduces the total amount of data that is available to the technician to classify the vehicle. Furthermore, the sensed data may be very noisy due to sensor characteristics, environmental conditions or other sources in the area. Lastly, each type of data can characterize only certain aspects of the vehicle. As a result, the sensed data may not characterize the vehicle with sufficient specificity to classify it with the desired confidence and precision.

The SURTASS system developed by Hughes Electronics, the assignee of the present invention, uses one or more acoustic sensors to passively sense acoustic emanations from passing submarines. No other types of data are gathered and used in the classification process. The acoustic data is passed to a computer that filters the data and then computes its temporal frequency response or spectrogram, commonly known as a LOw Frequency Analysis Response (LOFARgram), which is displayed as a time-frequency-intensity plot on a terminal. The technician is trained to recognize distinctive acoustic patterns in the LOFARgram and classify the submarine.

The VLF Home Page found on the Internet at dlc@nova.stanford.edu as updated on Jun. 13, 1995 presented a discussion of lightning-generated whistlers in the Earth's geomagnetic field. A network of low frequency (0–10 kHz) magnetic sensors are used to detect the magnetic emanations associated with lightning. These measurements are typically performed in remote locations in the Northern Hemisphere or Antarctica to avoid other sources of low frequency magnetic signals such as the strong 60 Hz signal associated with local power grids or the low frequency emanations generated by vehicles, which would appear as noise and tend to obscure the lightning. To observe and study the lightning-generated whistlers, the sensed magnetic signals are first mapped into audio signals that sound like decaying whistles and displayed in coordinates of frequency versus time, with the intensity indicated by the color of the display. This illustrates what lightning looks and sounds like in the low frequency spectrum.

SUMMARY OF THE INVENTION

In view of the above problems, the present invention provides a system for passively sensing EM emanations from vehicles and classifying them on that basis.

This is accomplished by sensing the low frequency EM emanations between 5 Hz and 50 kHz from a vehicle, computing a temporal frequency response, extracting harmonic, non-harmonic and temporal features from the response, and using them to classify the vehicle. In the preferred embodiment, the temporal frequency response is displayed as a time, frequency and intensity plot, from which a technician visually extracts these features. The features can then be used either to determine a "signature" for classifying the vehicle or to determine specific characteristics which, in turn, can be used to classify the vehicle. Alternately, the feature extraction and classification can be performed by an automated classifier.

These and other features and advantages of the invention will be apparent to those skilled in the art from the following detailed description of preferred embodiments, taken together with the accompanying drawings, in which:

DETAILED DESCRIPTION OF THE INVENTION

The present invention provides a passive system for classifying vehicles based upon their low frequency electro-magnetic (EM) emanations (5–50 kHz) either independently or in conjunction with known visual, thermal, seismic or acoustic classification systems. When used in conjunction with these other systems, the inclusion of EM data increases the redundancy of information from which certain vehicle characteristics can be determined and provides additional characteristics unique to EM detection.

It is readily known that vehicles such as submarines, cars, trucks, and planes generate low frequency EM signals. However, conventional wisdom is to treat these EM signals as a source of noise that cannot be used to classify vehicles, and thus should be either avoided or filtered. The treatment of vehicle EM emanations as noise is due in part to the lack of characterization data about particular vehicles and the insensitivity of off-the-shelf EM sensors to these low frequency emanations. These factors combined with the amount of low frequency harmonic and transient noise present in the environment caused people in the field to believe that it would be impractical to detect vehicle emanations and use them to classify the vehicle with a sufficiently high degree of confidence and precision.

Applicant has discovered that features such as harmonic interrelationships, strong non-harmonic components and temporal properties of identifiable signals can in fact be detected and extracted from the vehicle's temporal frequency response (spectrogram) and used either to directly discern a vehicle signature or to extract specific characteristics from which the vehicle can be classified. Adequate performance has been realized using known EM sensors and rudimentary vehicle characterizations in the presence of strong harmonic and transient noise signals. Applicant expects the classification performance to increase as more complete and accurate characterization data is developed and as more sensitive EM sensors are designed for the particular purpose of sensing vehicle EM emanations.

Figure 1:
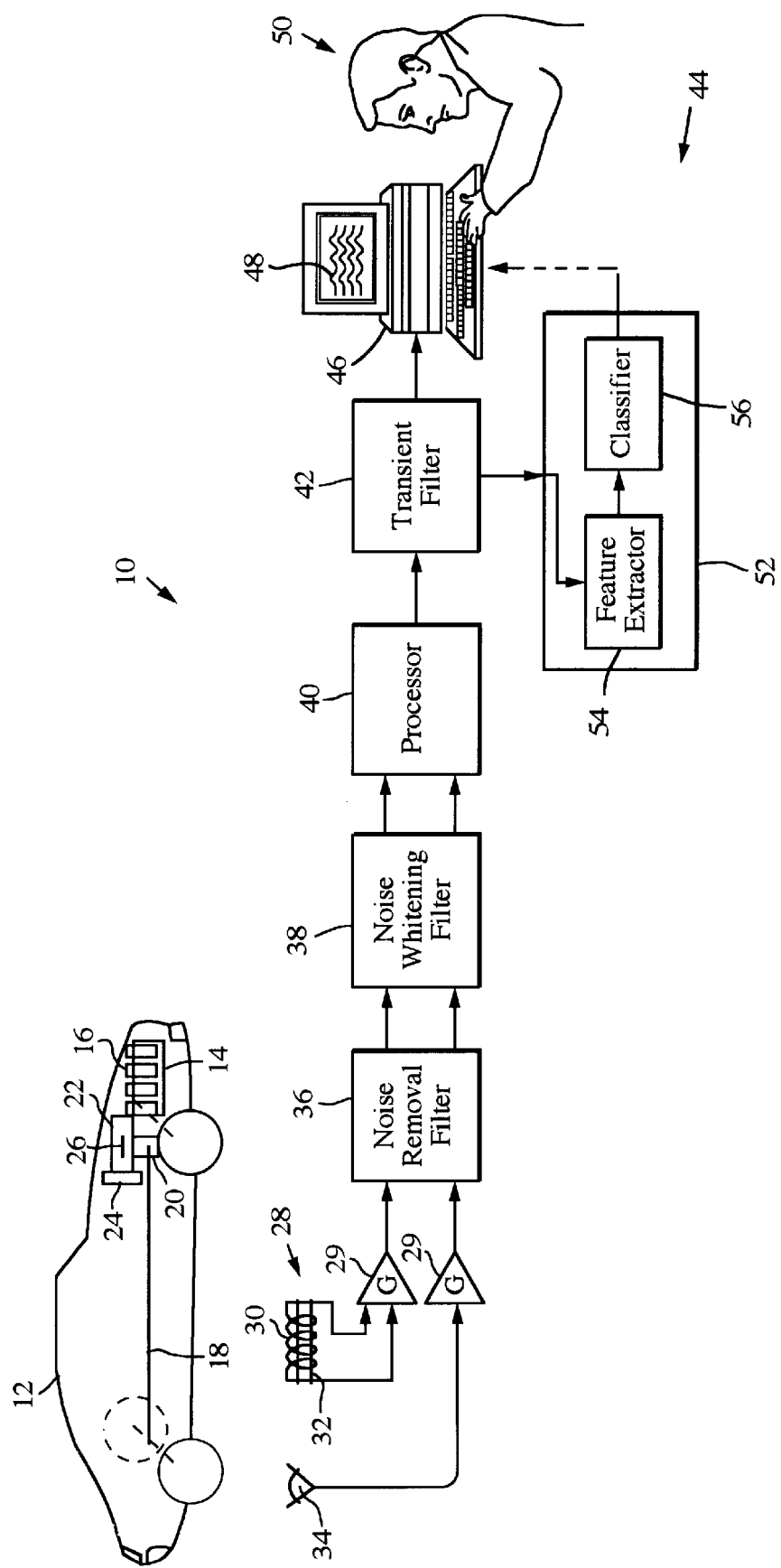
FIG. 1 is a block diagram of a system for classifying EM vehicles in accordance with the present invention.

FIG. 1 illustrates a passive EM vehicle classification system 10 for classifying vehicles 12 based upon their low frequency EM emanations. The vehicles' many different electrical and mechanical systems generate low frequency EM signals between 5 Hz and 50 kHz at varying intensity levels. The car depicted in FIG. 1 includes a 4-cycle combustion engine 14 that fires a plurality of cylinders 16 at an ignition frequency $F_I$ to rotate a crankshaft 18 that is engaged through a transmission 20 to power the car. The car emits relatively weak EM signals at the crankshaft's rotation frequency $F_C$ and its harmonics and relatively strong EM signals at the ignition frequency $F_I$ and its harmonics. The harmonic interrelationship of these signals are indicative of the number of cylinders N, for example, 4,6 or 8. As the car changes speed, the crankshaft and ignition frequencies will exhibit a temporal response that is characteristic of the type of transmission; manual or automatic. The car's alternator 22 is coupled to the crankshaft 18 by a pulley 24, which causes a d-pole rotor 26 inside the alternator to rotate and produce a strong electrical signal at a non-harmonic alternator frequency $F_A$. The pulley ratio, which is indicative of different types of cars, can be determined from the interrelationship of the crankshaft and alternator frequencies. Further testing that improves the characterization of the vehicle and improved EM sensors are expected to reveal other systems such as the vehicle's lighting system that emanate distinctive low frequency EM signals that can be used to classify the vehicle.

The passive EM vehicle classification system 10 includes at least one EM sensor 28 that couples the EM signals produced by the vehicle, the local power grid, and lightning into at least one electrical signal that is amplified by a pre-amplifier 29. The EM sensors 28 may include a coil 30 that is wrapped around a magnetically permeable core 32 for coupling magnetic signals or an antenna 34 for coupling electrical signals. An important practical advantage, is that EM sensors, unlike optical or acoustic sensors, can be hidden or buried.

In the system that was used to produce the spectrograms shown in FIGS. 3–6, the EM sensor 28 included a pair of 3-axis search coils that were assembled from off-the-shelf relay coils. The sensitivity of the coils, and thus the classification performance, may be improved by designing them to detect specific frequency bands associated with known vehicle systems. In addition, the coils may be designed to remove the strong 60 Hz signal component, thereby allowing greater pre-amplification.

However, since currently available EM sensors do not remove the 60 Hz signal, a noise removal filter 36 is used to reject the 60 Hz component. This can be done in a number of ways including subtracting the EM signal that is detected when no vehicle is present from the measured EM signals or by using the filter described in U.S. Pat. No. 5,425,105 entitled "Multiple Adaptive Filter Active Noise Canceler." The same techniques can also be used to remove other known sources of noise. The filtered signal is then passed to a noise whitening filter 38 that is designed so that the power spectral density of the filtered signal is approximately flat over the frequency range when collecting only background EM emanations in the absence of a vehicle.

The filtered signal is then passed to a processor 40 that computes its temporal frequency response. This is preferably done using a commercial fast fourier transform (FFT) routine, such as is found in Matlab, that operates on samples of the filtered signal. The routine's window size (number of samples) is selected to define a bin size (frequency range) that provides adequate frequency resolution of the detected EM signals, suitably 1–10 Hz. A transient filter 42 low pass filters the signals in the temporal frequency response associated with each of the bins to remove the noise produced by transient EM sources such as lightning.

Figure 2:
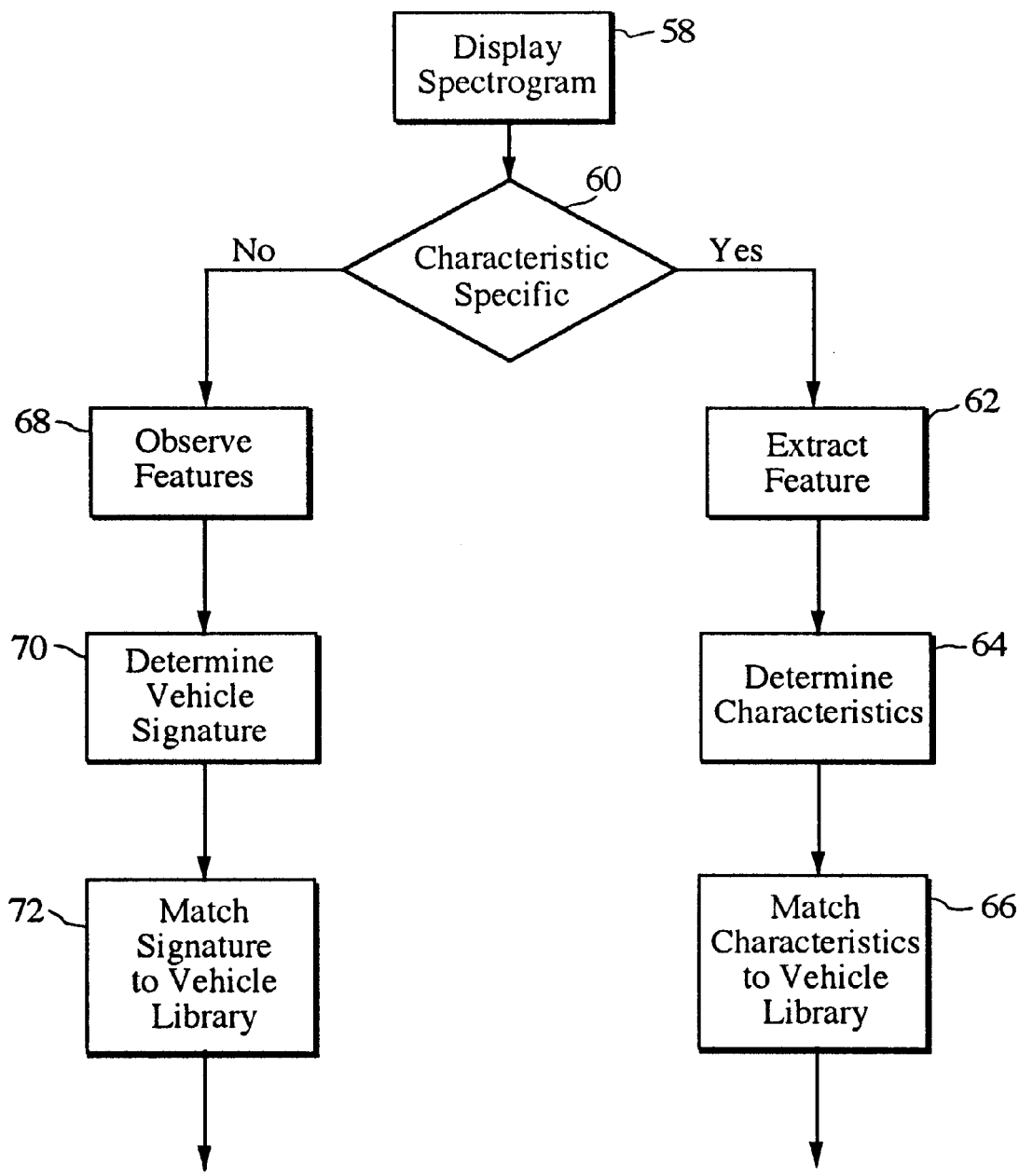
FIG. 2 is a flow chart illustrating the feature extraction and classification of vehicles in FIG. 1.

The temporal frequency response is then passed to a processing unit 44 that is capable of interpreting the response, extracting salient features of detectable vehicles in the vicinity of the EM sensor, and classifying the vehicle as described in detail in FIG. 2. In the currently preferred embodiment, the processing unit includes a display 46 that displays the temporal frequency response as a time-frequency-intensity plot 48, in which time is plotted on the horizontal axis, frequency is plotted on the vertical axis, and intensity is represented by the color or gray-scale shade of the plot. A human technician 50, who is trained to recognize harmonic, non-harmonic and temporal patterns in the plot, observes or extracts distinguishing features and used them to classify the vehicle 12.

Alternately, the processing unit 44 may include an automated classifier 52 in place of or in addition to the human technician 50. The automated classifier 52 includes a feature extractor 54 that is designed to identify and extract distinctive features in the temporal frequency response such as harmonic interrelationships, strong non-harmonic signals, and temporal properties. A classifier 56 such as a Bayesian or Neural Net classifier processes the extracted features to classify the vehicle. Typically, the classifier 56 is trained off-line with EM signal data from known vehicles until it learns to associate certain features with the different vehicles. This can be done in a single step, in which the classifier maps all of the feature data to the classified data, or in two steps, in which the classifier first maps the feature data into specific characteristics such as the number of cylinders, pulley ratio and transmission type and then uses those characteristics to classify the vehicle.

Although the principles underlying feature extraction and classification algorithms are well known and used extensively in signal processing applications, the use of an automated classifier in this particular problem is currently beyond the state-of-the-art, i.e. the classification results are not accurate enough to use in practice. Although the current characterization of different vehicles is sufficient to allow a trained technician to detect and identify a few systems, the characterization is not complete enough to allow a computer to perform the same function. The different vehicles must be isolated and tested to accurately identify the systems and the EM signals they produce. This data will then be used to design the feature extractor 54 and train the classifier 56. Secondarily, humans are better able to identify and extract the desired signals from noise than are computers. Thus, EM sensors that are specially designed to detect the EM signals emanated by vehicles will improve the performance of the automated classifier.

FIG. 2 illustrates the steps performed by the technician, or analogously by the automated classifier, shown in FIG. 1 to classify the vehicle. The technician views the displayed spectrogram (step 58) and performs either a characteristic specific analysis or a "signature" analysis on the spectrogram (step 60) to classify the vehicle. In a characteristic specific analysis, the technician identifies and extracts specific features from the spectrogram such as harmonic signal patterns, strong-non harmonic signals, and temporal properties (step 62) that the technician knows from experience correspond to specific vehicle systems. Thereafter, the technician uses these features to determined characteristic values such as the number of cylinders or the pulley ratio or types such as manual or automatic transmission (step 64). The technician then matches these characteristics against a library of known characteristics for different vehicles to classify the vehicle (step 66). The classification precision will depend upon how many different characteristics are identified and how unique they are. For example, classification may be as simple as identifying whether the vehicle is civilian or military or as complex as identifying the specific make and model of a vehicle.

In a signature analysis, the technician observes but does not extract specific features (step 68). Together the observed features represent a signature of the vehicle (step 70). The technician then matches the observed signature against a library of signatures to classify the vehicle (step 72). An experienced technician may recognize the observed signature as a specific class of vehicles or the specific make and model without explicitly matching it against the known signatures.

Figure 3:
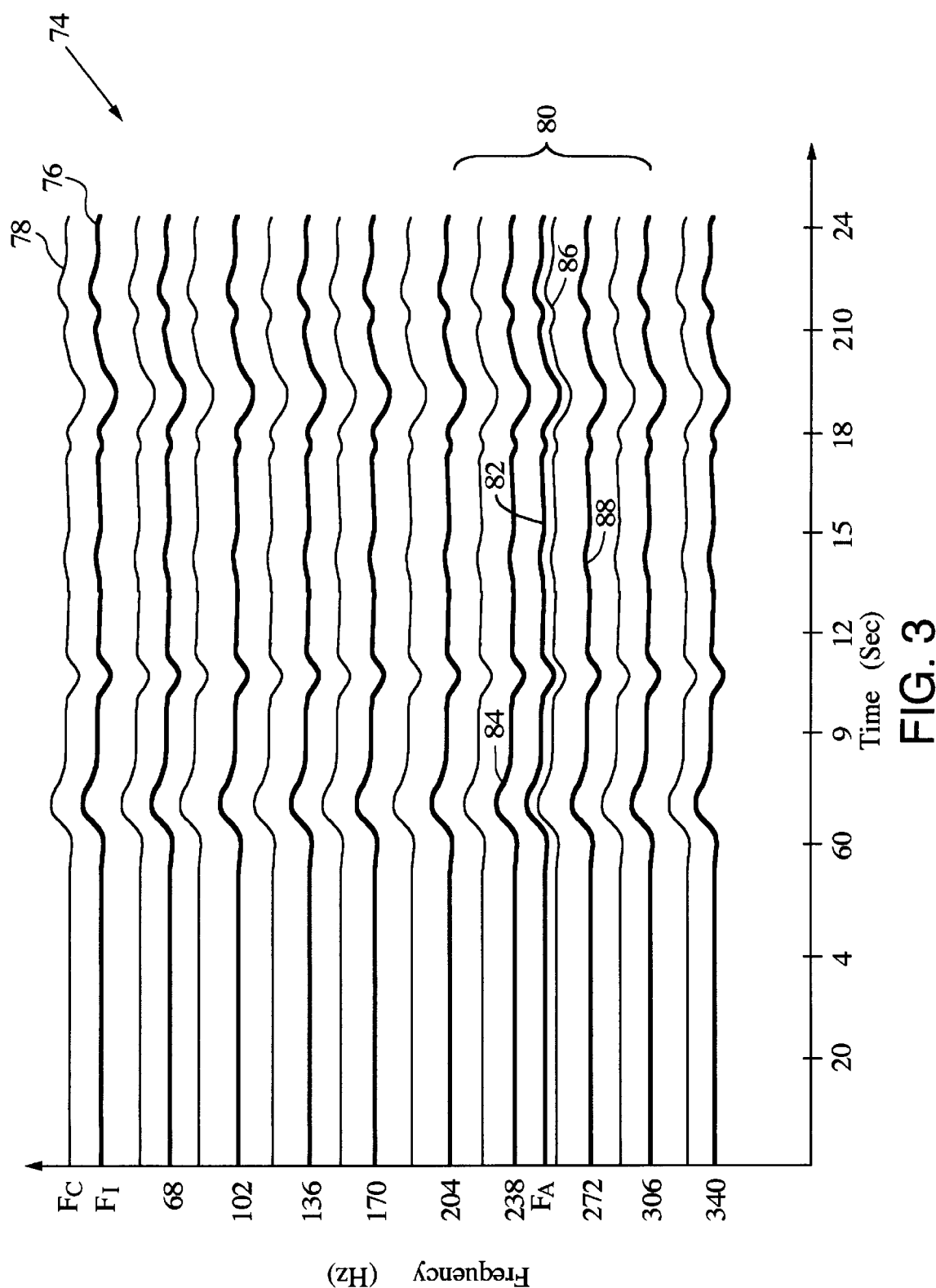
FIG. 3 is a plot of an EM spectrogram illustrating the harmonic interrelationships produced by a vehicle's combustion engine, which are indicative of the number of cylinders in the engine, and a strong non-harmonic component produced by a vehicle's alternator, which is indicative of the alternator's pulley ratio.

FIG. 3 is a plot 74 of the spectrogram generated by a 4-cylinder vehicle having a hand-measured alternator pulley ratio of approximately 2.45. In a standard 4-cycle combustion engine having 4 cylinders, an ignition pulse is emitted twice for every revolution of the engine. This signal is rich in harmonics, which show up on the spectrogram as a set of equally spaced lines 76. In this case, the fundamental frequency of this line is approximately 34 Hz, and has harmonics that appear at every 34 Hz thereafter (68 Hz, 102 Hz, 136 Hz, etc.) The ignition frequency is denoted $F_I$ and in this case is 34 Hz.

Another signal is generated that is weaker than the ignition signal, and whose fundamental frequency is equal to the speed of the crankshaft in the engine. It too is rich in harmonics, which also appear as a set of equally spaced lines 78 on the spectrogram. In this example case, the fundamental frequency of this line is approximately 17 Hz, and has harmonics that appear every 17 Hz thereafter (34 Hz, 51 Hz, 68 Hz, etc.) This is denoted as the crankshaft frequency, or $F_C$.

For a standard 4 cycle gasoline engine, the number of cylinders, N, is equal to $2F_I/F_C$. In this examplary case, N=2×34 Hz/17 Hz=4. A human operator would determine that N=4 by looking at the spectrogram and observing the strong-weak-strong-weak pattern corresponding to the relationship between $F_I$ (strong lines) and $F_C$ (weak lines). For a 6-cylinder engine, $F_I$=3×$F_C$. This would be displayed as a strong-weak-weak-strong-weak-weak pattern on the spectrogram.

A typical automotive alternator (where the number of poles d in the alternator rotor is 6) emits a signal having a frequency of 6 times its rotational speed. The frequency of this signal is denoted $F_A$. The speed of the alternator is in turn, equal to $r_P \times F_C$, where $r_P$ is the ratio of the size of the crankshaft pulley to the size of the alternator pulley. This relationship defines the following equation:

$$F_A = d \times r_P \times F_C$$

Thus, the pulley ratio can be solved as follows:

$$r_P = F_A/(d \times F_C).$$

Different types of engines from different manufactures will all have pulley ratios that are somewhat different. Thus, this information can be very useful in classifying a vehicle. Furthermore, most known vehicles have a pulley ratio that lies between 2 and 3.

Based upon these assumptions, the technician computes a frequency range 80 in which to expect a relatively strong intensity level 82 at a non-harmonic frequency that corresponds to the EM signal produced by the alternator. The technician then looks into the frequency range and, if it exists, extracts the strong signal and equates its frequency to $F_A$. If a strong non-harmonic signal is not identified, the technician can select the next most popular number of poles d in the rotor and repeat the process. Once the alternator frequency $F_A$ has been determined and the number of poles d fixed, the pulley ratio $r_P$ is computed. In the case shown, a strong non-harmonic component was identified at approximately 80% of the way between the 14th and 15th harmonics, 84 and 86, respectively, of the crankshaft frequency, or the 7th and 8th harmonics of the ignition frequency, 84 and 88, respectively, for the 4-cylinder vehicle. Because the engine has 4-cylinders, the even order harmonics of the crankshaft frequency occur at the same frequency as the harmonics of the ignition frequency. The measured non-harmonic component 82 corresponds to a pulley ratio of 2.47, which is very close to the hand-measured value of 2.45.

Figure 4:
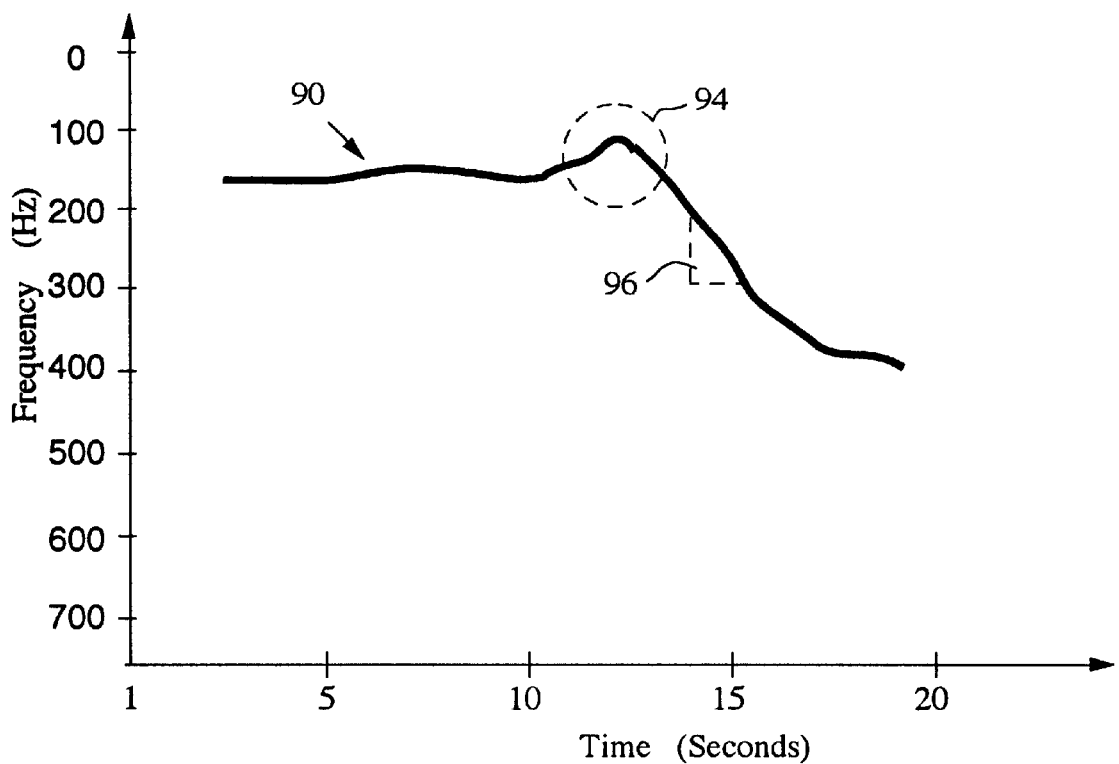
FIG. 4 is a plot of an EM spectrogram illustrating the temporal response of the ignition frequency and its harmonics for a manual transmission vehicle when the vehicle is accelerating.
Figure 5:
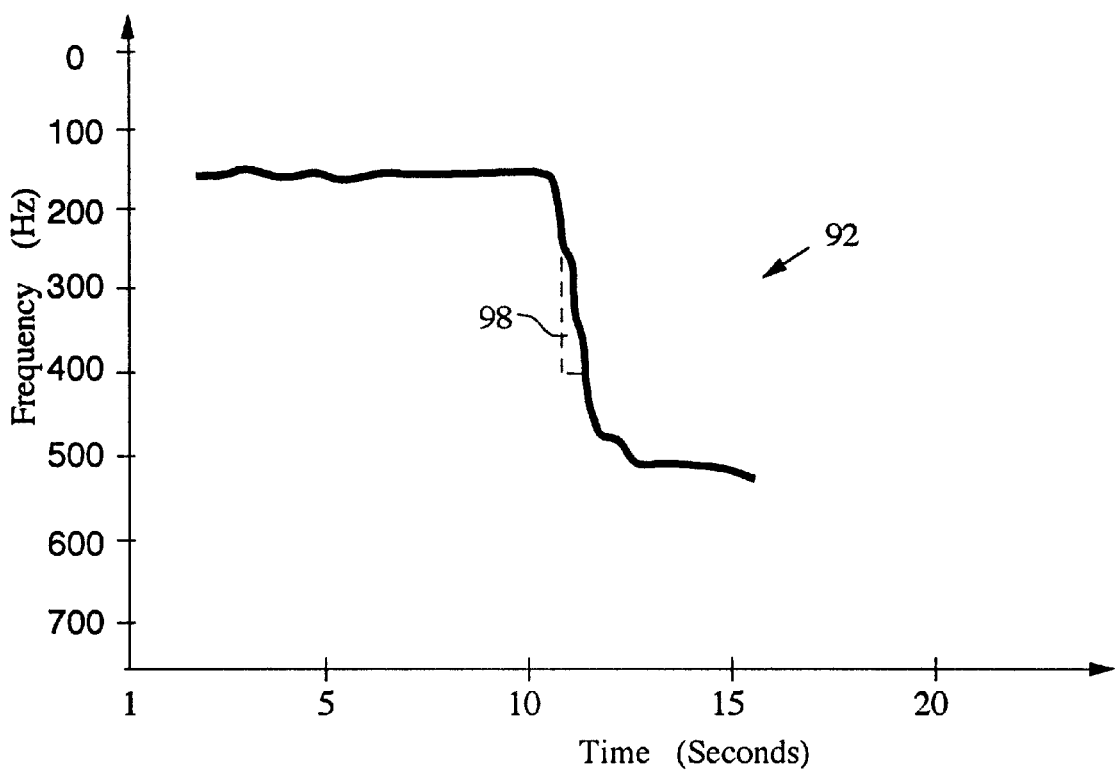
FIG. 5 is a plot of an EM spectrogram illustrating the temporal response of the ignition frequency and its harmonics for an automatic transmission vehicle when the vehicle is accelerating.

FIGS. 4 and 5 are plots of the spectrograms 90 and 92 generated by manual and automatic transmission vehicles, respectively. As shown in FIG. 4, the manual transmission vehicle was stopped and then started to accelerate. The spectrogram 90 reveals two distinctive temporal properties of a manual transmission vehicle. First, when the driver releases the clutch, the engine's RPMs dip momentarily, which is reflected as a dip 94 in frequency of the harmonic components associated with both the crankshaft and ignition. This is characteristic of the clutch being released in a manual transmission vehicle. Second, because the engine speed is directly coupled to the vehicle speed, the rate of change 96 of the ignition and crankshaft frequencies is equal to the vehicle's acceleration. If the driver downshifts to decelerate the vehicle, the engine's RPMS will momentarily increase and the rate of change of the ignition and crankshaft frequencies will be equal to the deceleration.

As shown in FIG. 5, the spectrogram 92 of an automatic transmission vehicle that is accelerating from a stop also reveals two distinctive temporal properties. First, because there is no clutch to engage, the engine's RPMs do not dip when the vehicle accelerates. Second, the engine's RPMs, and hence the frequency of the harmonic components associated with both the crankshaft and ignition, exhibit a profound jump 98 as the vehicle is accelerated. Automatic transmissions include a torque converter that trades off engine RPM for torque, thereby permitting the engine to speed up much faster than the vehicle itself accelerates. As a result, a technician can monitor the temporal properties of a strong harmonic component, typically of the ignition frequency, when the vehicle is changing speed and use these distinctive features to determine what type of transmission the vehicle has, which, in turn, can be used to classify the vehicle.

While several illustrative embodiments of the invention have been shown and described, numerous variations and alternate embodiments will occur to those skilled in the art.

For example, the same techniques can be used to identify features and characteristics of other vehicle systems. Although, the invention was described in conjunction with a 4-cycle combustion engine it would also be applicable to vehicles that use other sources of power. Such variations and alternate embodiments are contemplated, and can be made without departing from the spirit and scope of the invention as defined in the appended claims.

We claim:

1. A method for classifying vehicles that emanate low frequency electro-magnetic (EM) signals, comprising:
    a) passively sensing low frequency EM signals emanated from a vehicle;
    b) computing the temporal frequency response of the EM signals;
    c) extracting features from the temporal frequency response;
    d) using the extracted features to determine a set of vehicle characteristics; and
    e) using the set of vehicle characteristics to classify the vehicle;
    wherein the vehicles comprise a 4-cycle combustion engine having a rotating crankshaft and a plurality of cylinders that fire at ignition frequencies $F_I$, equal to one-half their crankshaft frequency $F_C$ times the number of cylinders N in that vehicle, said engine emanating relatively weak EM signals at the harmonic frequencies of the crankshaft frequency $F_C$ and relatively strong intensity levels at the harmonic frequencies of the ignition frequency $F_I$, said harmonic features being extracted by identifying a first harmonic interrelationship between the relatively weak signal emanations and a second harmonic interrelationship between relatively strong signal emanations, said first and second harmonic interrelationships being used to compute the crankshaft and ignition frequencies, respectively, from which the number of cylinders N in the vehicle's engine is computed and used to classify the vehicle.

2. The method of claim 1, wherein non-harmonic features are extracted by using a priori information to first select a frequency range for a particular vehicle characteristic and then identifying a relatively strong intensity level in the temporal frequency response that occurs at a non-harmonic frequency in that frequency range.

3. The method of claim 2, wherein the vehicles comprise a 4-cycle combustion engine having a crankshaft that rotates at a crankshaft frequency $F_C$ and an alternator with a d-pole rotor that rotates inside the alternator at an alternator frequency $F_A$, is equal to $d \times F_C \times r_P$ where $r_P$ is the engine's pulley ratio and known to lie in a given range, said alternator emanating a relatively strong non-harmonic signal at the alternator frequency, said non-harmonic features being extracted by first selecting said frequency range using the pulley ratio's given range, selecting the relatively strong intensity level in said frequency range, and assigning its frequency as the alternator frequency $F_A$, from which the pulley ratio is computed.

4. A method for classifying vehicles that emanate low frequency electro-magnetic (EM) signals, comprising:
    a) passively sensing low frequency EM signals emanated from a vehicle;
    b) computing the temporal frequency response of the EM signals;
    c) extracting features from the temporal frequency response;
    d) using the extracted features to determine a set of vehicle characteristics; and
    e) using the set of vehicle characteristics to classify the vehicle;
    wherein harmonic features are extracted by identifying a plurality of intensity levels in said temporal frequency response that are approximately uniformly spaced apart in frequency;
    wherein temporal features are extracted by monitoring the dynamic properties of the extracted harmonic features;
    and wherein said vehicle comprises a 4-cycle engine that fires a plurality of cylinders at an ignition frequency $F_I$, to rotate a crankshaft that is engaged through a transmission to power the vehicle, said engine emanating strong low frequency EM signals at the ignition frequency $F_I$ and its harmonics, said temporal features being extracted by detecting momentary dips in the ignition and harmonic frequencies when the vehicle is accelerating and determining a rate of change for the frequencies, said temporal features being compared against the characteristics of a manual transmission, which include momentary dips in frequency when the clutch is engaged and a rate of change that is proportional to the change in the vehicle's speed, and the characteristics of an automatic transmission, which include a smooth frequency response and a rate of change that exceed the change in the vehicle's speed, to characterize the vehicle's transmission as manual or automatic.

5. A method for classifying vehicles that emanate low frequency electro-magnetic (Em) signals, comprising:
    a) passively sensing low frequency EM signals emanated from a vehicle between 5 Hz and 50 kHz;
    b) computing the temporal frequency response of the EM signals;
    c) displaying the temporal frequency response as a time, frequency, intensity plot on a display;
    d) visually extracting features from the time, frequency, intensity plot including harmonic, non-harmonic, and temporal properties;
    e) using the extracted features to determine a set of vehicle characteristics;
    f) comparing the set of vehicle characteristics to the known characteristics for a plurality of candidate vehicles to classify the vehicle; and
    wherein the vehicle comprise a 4-cycle combustion engine that fires a plurality of cylinders at an ignition frequency $F_I$ to rotate a crankshaft that is engaged through a transmission to power the vehicle, said ignition frequency $F_I$ being equal to one-half the crankshaft frequency $F_c$ times the number of cylinders N in the vehicle, said engine emanating relatively weak EM signals at the harmonic frequencies of the crankshaft frequency $F_c$ and relatively strong intensity levels at the harmonic frequencies of the ignition frequency $F_I$, said harmonic features being extracted by identifying a first harmonic interrelationship between the relative weak signal emanations and a second harmonic interrelationship between relatively strong signal emanations, said first and second harmonic interrelationships being used to compute the crankshaft and ignition frequencies, respectively, from which the number of cylinders N in the vehicle's engine is computed and used to classify the vehicle.

6. The method of claim 5, wherein the set of vehicle characteristics corresponds to a signature for the vehicle, said signature being compared to the known signatures for a plurality of candidate vehicles to classify the vehicle.

7. The method of claim 5, wherein the vehicle characteristics in said set each correspond to a specific system in the vehicle that together characterize the vehicle.

8. The method of claim 5, wherein the vehicles further comprise an alternator with a d-pole rotor that rotates inside the alternator at an alternator frequency $F_A$, is equal to $d \times F_C \times r_P$ where $r_P$ is the engine's pulley ratio and known to lie in a given range, said alternator emanating a relatively strong non-harmonic signal at the alternator frequency, said non-harmonic features being extracted by first selecting said frequency range using the pulley ratio's given range, selecting the relatively strong intensity level in said frequency range, and assigning its frequency as the alternator frequency $F_A$, from which the pulley ratio is computed.

9. The method of claim 5, wherein said temporal features are extracted by detecting momentary dips in the ignition and harmonic frequencies when the vehicle is accelerating and determining a rate of change for the frequencies, said temporal features being compared against the characteristics of a manual transmission, which include momentary dips in frequency when the clutch is engaged and a rate of change that is proportional to the change in the vehicle's speed, and the characteristics of an automatic transmission, which include a smooth frequency response and a rate of change that exceed the change in the vehicle's speed, to characterize the vehicle's transmission as manual or automatic.

10. A system for classifying electro-magnetic (EM) vehicles, comprising:
a vehicle having a 4-cycle combustion engine that emanates low frequency EM signals that have distinctive harmonic interrelationships, strong non-harmonic components, and distinctive temporal properties;
a sensor for passively sensing the low frequency EM signals from the vehicle;
a processor for computing the temporal frequency response of the EM signals and representing them as a time, frequency, intensity plot; and
a display that displays the time, frequency, intensity plot from which a person can observe harmonic interrelationships, strong non-harmonic components and temporal properties as features of the vehicle and use them to classify the vehicle.

11. The system of claim 10, wherein said sensor senses EM signals in a frequency range from approximately 5 Hz to 50 kHz.

12. The system of claim 10, wherein said vehicle's 4-cycle combustion engine has a rotating crankshaft and a plurality of cylinders that fire at an ignition frequency $F_I$ equal to one-half the crankshaft frequency $F_C$ times the number of cylinders N, said engine emanating relatively weak EM signals at the harmonic frequencies of the crankshaft frequency $F_C$ and relatively strong EM signals at the harmonic frequencies of the ignition frequency $F_I$, said display displaying relatively weak intensity levels at the harmonic frequencies of the crankshaft frequency $F_C$ and relatively strong intensity levels at the harmonic frequencies of the ignition frequency $F_I$ from which the person can compute the crankshaft and ignition frequencies and use them to identify the number of cylinders N in the vehicle's engine.

13. The system of claim 12, wherein said combustion engine includes an alternator with a d-pole rotor that rotates inside the alternator at an alternator frequency $F_A$, which lies in a known frequency range with respect to the crankshaft frequency, and is equal to $d \times F_C \times r_P$ where $r_P$ is the engine's pulley ratio, said alternator emanating a relatively strong non-harmonic signal at the alternator frequency, said display displaying a strong non-harmonic intensity level that lies in the known frequency range, from which the person can determine the alternator frequency $F_A$ and compute the pulley ratio $r_P$.

14. The system of claim 12, wherein said vehicle further comprises a transmission that exhibits different temporal ignition frequency characteristics when accelerating depending on whether it is an automatic or a manual transmission, said display displaying the temporal characteristics of the relatively strong intensity levels at the harmonic frequencies of the ignition frequency $F_I$, from which the person can detect momentary dips in the harmonic frequencies, which is indicative of a manual transmission, and can determine a rate of change of the harmonic frequencies that exceeds the vehicle's acceleration, which is indicative of an automatic transmission.

15. The system of claim 10, wherein said temporal frequency response is resolved into a plurality of frequency bins, further comprising:
a transient noise filter that low pass filters the EM signal in each said frequency bin to reduce the noise associated with transient EM signals.

16. The system of claim 15, further comprising a noise reduction filter that pre-whitens the sensed EM signals so that its power spectral density is approximately flat when the EM sensor is sensing background EM signals in the absence of the vehicle.

17. A system for classifying electro-magnetic (EM) vehicles, comprising:
a sensor for passively sensing low frequency EM signals emanated from a vehicle;
a processor for computing the temporal frequency response of the EM signal; and
a classifier that a) extracts features from the temporal frequency response including harmonic interrelationships of the EM signals, strong non-harmonic EM signals, and temporal properties of strong EM signals, b) uses the features to identify known characteristics of possible vehicles, and c) classifies the vehicle based upon its identified characteristics.

18. The system of claim 17, wherein said EM vehicle emits EM signals in a frequency range from approximately 5 Hz to 50 kHz.

19. The system of claim 17, wherein said vehicle comprises a 4-cycle combustion engine having a rotating crankshaft and a plurality of cylinders that fire at an ignition frequency $F_I$ equal to one-half the crankshaft frequency $F_C$ times the number of cylinders N, said engine emanating relatively weak EM signals at the harmonic frequencies of the crankshaft frequency $F_C$ and relatively strong intensity levels at the harmonic frequencies of the ignition frequency $F_I$,
said classifier a) extracting a first harmonic interrelationship between the relatively weak signal emanations and a second harmonic interrelationship between relatively strong signal emanations, b) computing the crankshaft frequency $F_C$ from the first harmonic interrelationship, c) computing the ignition frequency $F_I$ from the second harmonic interrelationship, d) using the values of $F_C$ and $F_I$ to identify the number of cylinders N in the vehicle's engine, and e) using the number of cylinders N to classify the vehicle.

20. The system of claim 19, wherein said combustion engine includes an alternator with a d-pole rotor that rotates inside the alternator at an alternator frequency $F_A$, which lies in a known frequency range with respect to the crankshaft frequency, and is equal to $d \times F_C \times r_P$ where $r_P$ is the engine's pulley ratio, said alternator emanating a relatively strong non-harmonic signal at the alternator frequency, said classifier determining the known frequency range in which the alternator's non-harmonic signal can occur for the computed crankshaft frequency, extracting a relatively strong component from the temporal frequency response that occurs at a non-harmonic frequency in said known frequency range and assigning the component's frequency as the alternator frequency $F_A$, computing the pulley ratio $r_P$, and using it to classify the vehicle.

21. The system of claim 19, wherein said vehicle further comprises a transmission that exhibits different temporal ignition frequency characteristics when accelerating depending on whether it is an automatic or a manual transmission, said classifier monitoring the temporal response of the ignition frequency $F_I$ and its harmonics to detect momentary dips in those frequencies and to determine a rate of change for the harmonic frequencies, said classifier comparing these characteristics against the known temporal ignition frequency characteristics for automatic and manual transmission vehicles to classify the vehicle's transmission as being automatic or manual.

22. The system of claim 17, wherein said temporal frequency response is resolved into a plurality of frequency bins, further comprising:

a transient noise filter that low pass filters the EM signal in each said frequency bin to reduce the noise associated with transient EM signals.

23. The system of claim 22, further comprising a noise reduction filter that pre-whitens the sensed EM signals so that its power spectral density is approximately flat when the EM sensor is sensing background EM signals in the absence of the vehicle.

24. The system of claim 17, further comprising:

a display that displays the temporal frequency response on a time, frequency, intensity plot that displays the harmonic interrelationships of the EM signals, the strong non-harmonic EM signals, and the temporal properties of the strong signals, from which a person can observe these features, identify known characteristics of possible vehicles, and classify the vehicle based upon its identified characteristics to confirm or reject the classification made by the classifier.

* * * * *